United States Patent
Long et al.

(10) Patent No.: US 9,798,205 B2
(45) Date of Patent: Oct. 24, 2017

(54) LIQUID CRYSTAL DEVICES AND PANELS HAVING TOUCH FUNCTIONS

(71) Applicant: Shenzhen China Star Optoelectronics Technology Co., Ltd., Shenzhen, Guangdong (CN)

(72) Inventors: Chong Long, Guangdong (CN); Zhiyuan Shen, Guangdong (CN); Haiyan Sun, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 228 days.

(21) Appl. No.: 14/433,664

(22) PCT Filed: Jan. 28, 2015

(86) PCT No.: PCT/CN2015/071707
§ 371 (c)(1),
(2) Date: Apr. 4, 2015

(87) PCT Pub. No.: WO2016/095327
PCT Pub. Date: Jun. 23, 2016

(65) Prior Publication Data
US 2016/0342056 A1 Nov. 24, 2016

(30) Foreign Application Priority Data
Dec. 18, 2014 (CN) .......................... 2014 1 0802140

(51) Int. Cl.
*G06F 3/041* (2006.01)
*G02F 1/1362* (2006.01)
(Continued)

(52) U.S. Cl.
CPC ...... *G02F 1/136286* (2013.01); *G02F 1/1368* (2013.01); *G02F 1/13338* (2013.01);
(Continued)

(58) Field of Classification Search
CPC .......... G02F 1/133345; G02F 1/13338; G02F 1/134336; G02F 1/136227;
(Continued)

(56) References Cited

U.S. PATENT DOCUMENTS 9,519,374 B2 * 12/2016 Liu .................... G02F 1/133345
2008/0129706 A1 * 6/2008 Kim ...................... G06F 3/0412
345/174

(Continued)

FOREIGN PATENT DOCUMENTS

CN 202976039 U 6/2013

OTHER PUBLICATIONS

PACN1413117-ZX_OA, dated Apr. 2003, Office Action from China Patent Office.

*Primary Examiner* — Nelson Rosario
(74) *Attorney, Agent, or Firm* — Andrew C. Cheng

(57) ABSTRACT

A panel having touch function is disclosed. The panel includes a plurality of films, a plurality of touch electrodes arranged on different film layers, a plurality of leading wires respectively corresponding to the touch electrodes, and a touch chip. The leading wires electrically connect the touch electrodes to the touch chip, wherein the leading wires connecting a portion of the touch electrodes are arranged on a first film layer of the film layers and the leading wires connecting other portions of the touch electrodes are arranged on a second film layer of the film layers. In addition, a display device is also disclosed. In this way, the short circuit is avoided, and the possibility of failed touch electrode is also reduced.

4 Claims, 2 Drawing Sheets

(51) Int. Cl.
*G02F 1/1333* (2006.01)
*G02F 1/1343* (2006.01)
*G02F 1/1368* (2006.01)
*G06F 3/044* (2006.01)
*H01L 27/12* (2006.01)

(52) U.S. Cl.
CPC .. G02F 1/133345 (2013.01); G02F 1/134336 (2013.01); G02F 1/136227 (2013.01); G06F 3/044 (2013.01); G06F 3/0412 (2013.01); G06F 3/0416 (2013.01); *G02F 2001/134372* (2013.01); *G02F 2201/121* (2013.01); *G02F 2201/123* (2013.01); *H01L 27/1214* (2013.01)

(58) Field of Classification Search
CPC ............. G02F 1/136286; G02F 1/1368; G02F 2001/134372; G02F 2201/121; G02F 2201/123; G06F 3/0412; G06F 3/0416; G06F 3/044; H01L 27/1214
See application file for complete search history.

(56) References Cited

U.S. PATENT DOCUMENTS

| | | | |
|---|---|---|---|
| 2015/0028341 A1* | 1/2015 | Sun | H01L 27/124 257/72 |
| 2015/0070285 A1 | 3/2015 | Qiu | |
| 2016/0098113 A1 | 4/2016 | Ding et al. | |
| 2016/0259445 A1 | 9/2016 | Yang et al. | |
| 2016/0294386 A1 | 10/2016 | Yang et al. | |

\* cited by examiner

LIQUID CRYSTAL DEVICES AND PANELS HAVING TOUCH FUNCTIONS

BACKGROUND OF THE INVENTION

1. Field of the Invention

The present disclosure relates to display and touch technology, and more particularly to a display device and a touch panel having touch functions.

2. Discussion of the Related Art

Generally, operating principles of touch panels relate to connecting touch chips with touch electrodes via metallic lines so as to periodically charge or discharge the touch electrodes. Capacitance of pixels may be changed when the touch electrodes are touched by fingers. Coordinates of the touch points may be determined when the detected voltage, current, or charges are feedback to the chips via the metallic lines. Usually, the metallic lines between the touch electrodes and the driving control chips are on the same film, which is manufactured by exposure process. Traditional exposure process may cause short circuit due to a variety of particles or electrostatic, which results in failed touch electrodes. Especially, the failed possibility may increase for the area having a higher density of circuits.

Thus, it is needed to provide a liquid crystal device and a touch panel having touch functions to overcome the above problems.

SUMMARY

The object of the invention is to provide a liquid crystal device and a touch panel having touch functions to reduce the short circuit possibility of the leading wires of the touch electrodes, which contributes to reducing the possibility of the failed touch electrodes.

In one aspect, a panel having touch functions includes: a plurality of films, a plurality of touch electrodes arranged on different film layers, a plurality of leading wires respectively corresponding to the touch electrodes, and a touch chip, the leading wires electrically connect the touch electrodes to the touch chip, wherein the leading wires connecting a portion of the touch electrodes are arranged on a first film layer of the film layers, and the leading wires connecting other portions of the touch electrodes are arranged on a second film layer of the film layers, the touch electrodes are arranged on a third film layer of the film layers, the leading wires are arranged in parallel one by one, two adjacent leading wires are arranged on different film layers, and the leading wires electrically connect with corresponding touch electrodes via through holes.

In another aspect, a panel having touch functions includes: a plurality of films, a plurality of touch electrodes arranged on different film layers, a plurality of leading wires respectively corresponding to the touch electrodes, and a touch chip, the leading wires electrically connect the touch electrodes to the touch chip, wherein the leading wires connecting a portion of the touch electrodes are arranged on a first film layer of the film layers, and the leading wires connecting other portions of the touch electrodes are arranged on a second film layer of the film layers.

Wherein the pixel electrodes are arranged on a third film layer of the film layers.

Wherein the leading wires are arranged in parallel one by one, and two adjacent leading wires are arranged on different film layers.

Wherein the leading wires electrically connect with corresponding touch electrodes via through holes.

Wherein the panel further comprises an array substrate, and the touch electrodes are made by a common electrode layer of the array substrate.

Wherein the touch electrodes are arranged in a matrix.

Wherein the panel further comprises at least one pixel electrode and at least one thin film transistor (TFT), the pixel electrode is arranged on the third film layer, the TFT is arranged on a fourth film layer of the film layers, and the TFT electrically connects to the pixel electrode via a through hole.

Wherein the film layers are arranged on the array substrate.

Wherein the fourth film layer is arranged on the array substrate, the second film layer is arranged on the fourth film layer, the first film layer is arranged on the second film layer, the third film layer is arranged on the first film layer, and the pixel electrode is arranged on a surface of the third film layer away from the first film layer.

In another aspect, a display device includes: a panel having touch functions, the panel includes: a plurality of films, a plurality of touch electrodes arranged on different film layers, a plurality of leading wires respectively corresponding to the touch electrodes, and a touch chip, the leading wires electrically connect the touch electrodes to the touch chip, wherein the leading wires connecting a portion of the touch electrodes are arranged on a first film layer of the film layers, and the leading wires connecting other portions of the touch electrodes are arranged on a second film layer of the film layers.

Wherein the pixel electrodes are arranged on a third film layer of the film layers.

Wherein the leading wires are arranged in parallel one by one, and two adjacent leading wires are arranged on different film layers.

Wherein the leading wires electrically connect with corresponding touch electrodes via through holes.

Wherein the panel further comprises an array substrate, and the touch electrodes are made by a common electrode layer of the array substrate.

Wherein the touch electrodes are arranged in a matrix.

Wherein the panel further comprises at least one pixel electrode and at least one thin film transistor (TFT), the pixel electrode is arranged on the third film layer, the TFT is arranged on a fourth film layer of the film layers, and the TFT electrically connects to the pixel electrode via a through hole.

Wherein the film layers are arranged on the array substrate.

Wherein the fourth film layer is arranged on the array substrate, the second film layer is arranged on the fourth film layer, the first film layer is arranged on the second film layer, the third film layer is arranged on the first film layer, and the pixel electrode is arranged on a surface of the third film layer away from the first film layer.

In view of the above, the leading wires connecting the touch electrodes and the touch chip are arranged on different film layers such that the leading wires are not densely arranged, which may avoid the leading wires to contact with each other. In this way, the short circuit is avoided, and the possibility of failed touch electrode is also reduced.

DETAILED DESCRIPTION OF THE EMBODIMENTS

Embodiments of the invention will now be described more fully hereinafter with reference to the accompanying drawings, in which embodiments of the invention are shown.

Figure 1:
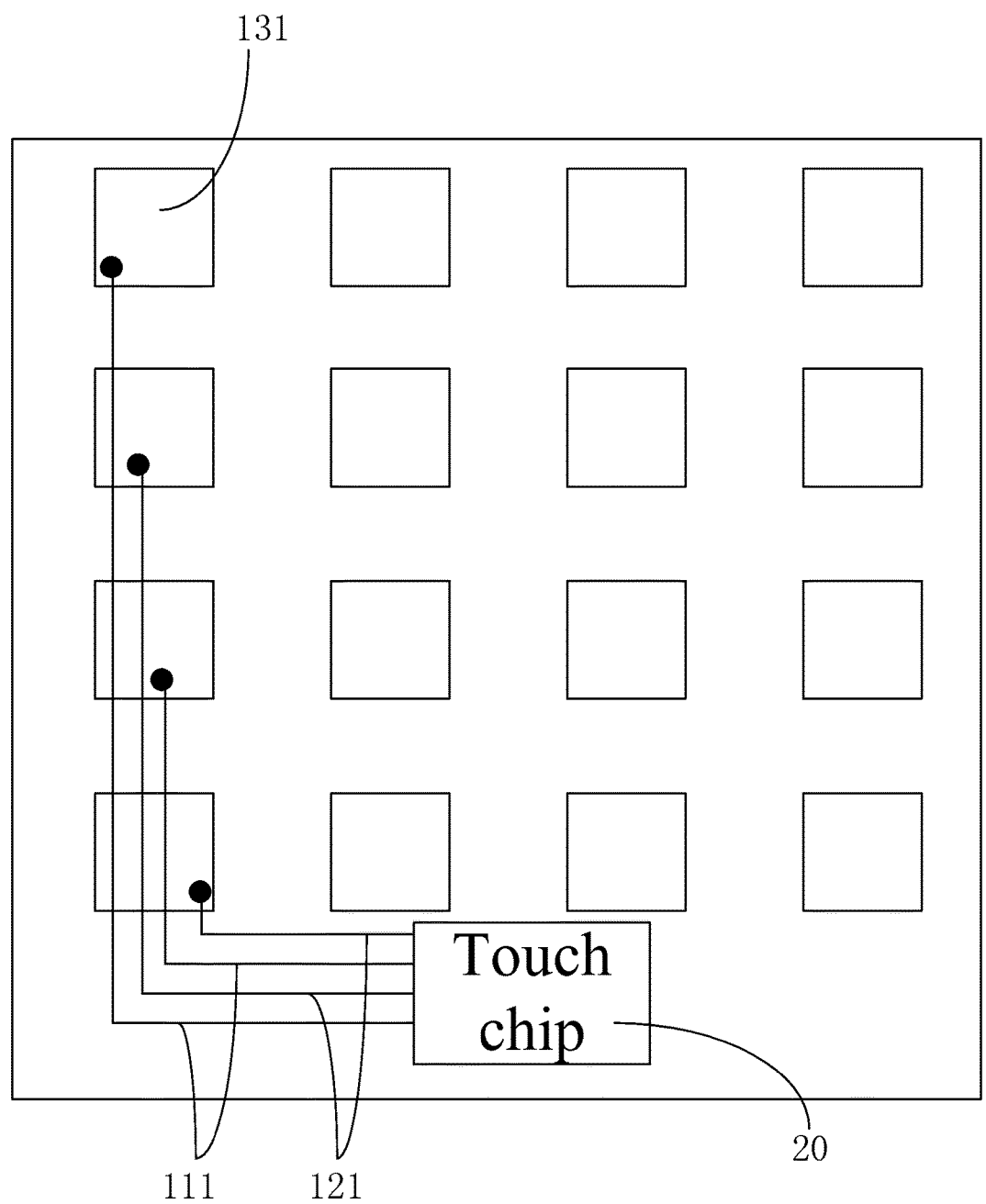
FIG. 1 is a top view of the panel having touch functions in accordance with one embodiment.
Figure 2:
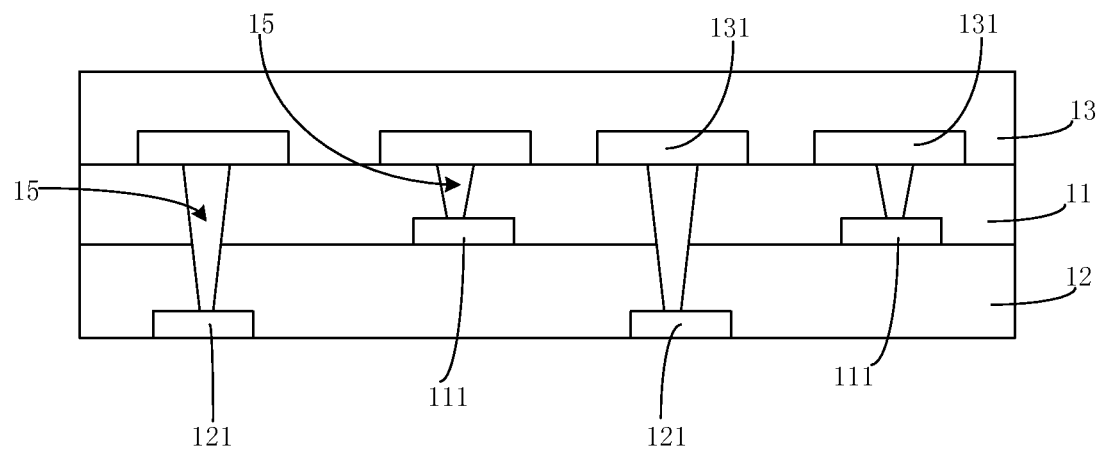
FIG. 2 is a partial cross section view of the panel having touch function in accordance with a first embodiment.

FIG. 1 is a top view of the panel having touch functions in accordance with one embodiment. FIG. 2 is a partial cross section view of the panel having touch function in accordance with a first embodiment. In the embodiment, the panel includes a plurality of film layers, a plurality of touch electrodes 131 arranged on different film layers, a plurality of leading wires 111, 121 respectively corresponding to the touch electrodes 131, and a touch chip 20. The leading wires 111, 121 electrically connect the touch electrodes 131 to the touch chip 20. The leading wires 111 connecting a portion of the touch electrodes 131 are arranged on a first film layer 11 of the film layers. The leading wires 121 connecting other portions of the touch electrodes 131 are arranged on a second film layer 12 of the film layers.

In the embodiment, the touch electrodes 131 are arranged on a third film layer 13 within the film layers. In other embodiments, the touch electrodes 131 may be arranged on the same layer with the leading wires 111 or the leading wires 121. Correspondingly, the other leading wires 111 or leading wires 121 may be arranged on different film layer with the touch electrodes 131.

In the embodiment, the leading wires 111, 121 are arranged in parallel one by one, and two adjacent leading wires 111, 121 are arranged on different film layers. The leading wires 111, 121 may be arranged along a length-direction or a width-direction of the panel in sequence. An odd number of the leading wire and the even number of the leading wire are arranged on different film layers. In other embodiments, the leading wires may be arranged in different film layers.

In an example, the leading wires 111, 121 electrically connect with corresponding touch electrodes 131 via through holes 15. For instance, one end of the leading wires 111 connects to the touch electrodes 131 via the through hole, and the other end of the first film layer 11 connect to the touch chip 20 so as to connect the touch electrodes 131 with the touch chip 20. The coordinates of the touch points are determined when the changed voltage, current, charge of the touch electrodes 131 are feedback to the touch chip 20 via the leading wires 111, 121.

In an example, the first film layer 11 is above the second film layer 12, and the third film layer 13 is above the first film layer 11.

In an example, the touch electrodes 131 are arranged in a matrix. As shown in FIG. 1, the touch electrodes 131 are arranged on the panel in a matrix. In an example, the touch electrodes 131 are arranged in a touch-effective area surrounding by a touch-ineffective area. The touch chip 20 is arranged within the touch-ineffective area. It is to be noted that, in other embodiments, within the touch-ineffective area, the leading wires 111 connecting to a portion of the touch electrodes 131 are arranged on the first film layer 11 of the film layers, and the leading wires 121 connecting to other portions of the touch electrodes 131 are arranged on the second film layer 12 of the film layers. In addition, within the touch-effective area, all of the leading wires 111 and the leading wires 121 are arranged on the same film layer. Thus, within the touch-effective area, all of the leading wires are arranged on the same layer so as to simplify the manufacturing process. Also, within the touch-ineffective area, as the short circuit may cause the positioning difficult due to the failed touch electrodes 131, a portion of the leading wires has to arranged on different film layers.

In an example, the first film layer 11, the second film layer 12, and the third film layer 13 are insulation layers.

In an example, the panel having the touch functions may include, but not limited to, other general display panels, touch panels, or components integrated with the touch panels. The display panels include, but not limited to, OLED display panels, TFT liquid crystal panels, and IPS liquid crystal panels. The touch panels may include self-capacitive or mutual capacitive type. The integrated touch panels may include, but not limited to, OGS full-bonded, In-Cell or On-Cell panels.

Figure 3:
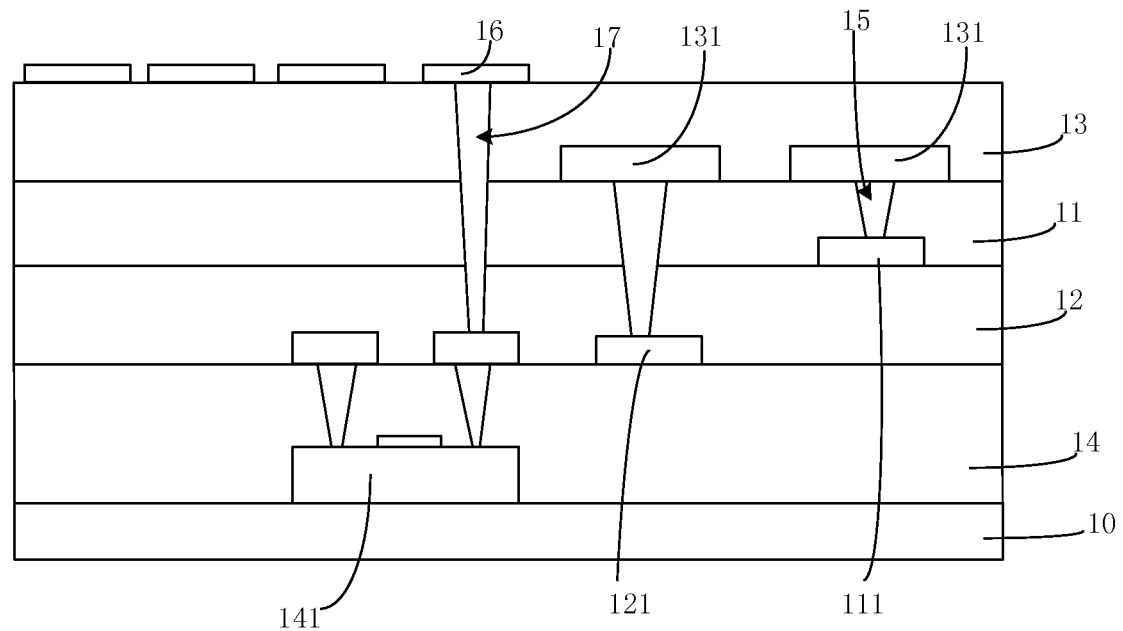
FIG. 3 is a partial cross section view of the panel having touch function in accordance with a second embodiment.

FIG. 3 is a partial cross section view of the panel having touch function in accordance with a second embodiment. Comparing to the first embodiment, the panel having touch functions further includes an array substrate 10. The touch electrodes 131 are made by a common electrode layer 13 of the array substrate 10. The panel having touch functions further includes at least one pixel electrode 16 and at least one thin film transistor (TFT) 141. The pixel electrode 16 is arranged on the third film layer 13. The TFT 141 is arranged on a fourth film layer 14. The TFT 141 electrically connects to the pixel electrode 16 via a through hole 17. The film layers are arranged on the array substrate 10.

In an example, the fourth film layer 14 is arranged on the array substrate 10. The second film layer 12 is arranged on the fourth film layer 14. The first film layer 11 is arranged on the second film layer 12. The third film layer 13 is arranged on the first film layer 11. The pixel electrode 16 is arranged on a surface of the third film layer 13 farther away from the first film layer 11.

In an example, the first film layer 11, the second film layer 12, the third film layer 13, and the fourth film layer 14 are insulation layers.

In view of the above, the leading wires connecting the touch electrodes and the touch chip are arranged on different film layers such that the leading wires are not densely arranged, which may avoid the leading wires to contact with each other. In this way, the short circuit is avoided, and the possibility of failed touch electrode is also reduced.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A panel having touch functions, comprising:
   a plurality of films, a plurality of touch electrodes arranged on different film layers, a plurality of leading wires respectively corresponding to the touch electrodes, and a touch chip, the leading wires electrically connect the touch electrodes to the touch chip, wherein the leading wires connecting a portion of the touch electrodes are arranged on a first film layer of the film layers, and the leading wires connecting other portions of the touch electrodes are arranged on a second film layer of the film layers;
   wherein the pixel electrodes are arranged on a third film layer of the film layers;

wherein the panel further comprises an array substrate, and the touch electrodes are made by a common electrode layer of the array substrate;

wherein the panel further comprises at least one pixel electrode and at least one thin film transistor (TFT), the pixel electrode is arranged on the third film layer, the TFT is arranged on a fourth film layer of the film layers, and the TFT electrically connects to the pixel electrode via a through hole;

wherein the film layers are arranged on the array substrate;

wherein the fourth film layer is arranged on the array substrate, the second film layer is arranged on the fourth film layer, the first film layer is arranged on the second film layer, the third film layer is arranged on the first film layer, and the pixel electrode is arranged on a surface of the third film layer away from the first film layer.

2. The panel as claimed in claim 1, wherein the leading wires are arranged in parallel one by one, and two adjacent leading wires are arranged on different film layers.

3. The panel as claimed in claim 1, wherein the leading wires electrically connect with corresponding touch electrodes via through holes.

4. The panel as claimed in claim 1, wherein the touch electrodes are arranged in a matrix.

* * * * *